(12) United States Patent
Kim

(10) Patent No.: US 10,756,153 B2
(45) Date of Patent: Aug. 25, 2020

(54) ORGANIC LIGHT EMITTING DISPLAY DEVICE

(71) Applicant: LG Display Co., Ltd., Seoul (KR)

(72) Inventor: Eunah Kim, Osan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/709,145

(22) Filed: Dec. 10, 2019

(65) Prior Publication Data

US 2020/0119118 A1    Apr. 16, 2020

Related U.S. Application Data

(62) Division of application No. 16/040,239, filed on Jul. 19, 2018, now Pat. No. 10,541,293.

(30) Foreign Application Priority Data

Jul. 31, 2017 (KR) .......................... 10-2017-0097342

(51) Int. Cl.
| | |
|---|---|
| *H01L 29/08* | (2006.01) |
| *H01L 27/32* | (2006.01) |
| *H01L 51/52* | (2006.01) |
| *H01L 51/00* | (2006.01) |

(52) U.S. Cl.
CPC ...... *H01L 27/3262* (2013.01); *H01L 27/3246* (2013.01); *H01L 27/3258* (2013.01); *H01L 27/3276* (2013.01); *H01L 51/0097* (2013.01); *H01L 51/5218* (2013.01); *H01L 51/5234* (2013.01); *H01L 51/5237* (2013.01); *H01L 51/5253* (2013.01); *H01L 51/52* (2013.01); *H01L 2251/5338* (2013.01)

(58) Field of Classification Search
CPC ............. H01L 27/3262; H01L 27/3246; H01L 27/3258; H01L 51/5218; H01L 51/0097
See application file for complete search history.

(56) References Cited

U.S. PATENT DOCUMENTS

| | | | |
|---|---|---|---|
| 2008/0308932 A1* | 12/2008 | Lii | ...................... H01L 23/3192 257/738 |
| 2014/0217373 A1 | 8/2014 | Youn et al. | |
| 2014/0254111 A1 | 9/2014 | Yamazaki et al. | |
| 2016/0111479 A1 | 4/2016 | Kim et al. | |
| 2016/0204366 A1 | 7/2016 | Zhang et al. | |

(Continued)

FOREIGN PATENT DOCUMENTS

| | | |
|---|---|---|
| CN | 104900153 A | 9/2015 |
| CN | 105789252 A | 7/2016 |

(Continued)

*Primary Examiner* — Phuc T Dang
(74) *Attorney, Agent, or Firm* — Seed IP Law Group LLP

(57) ABSTRACT

An organic light emitting display device is disclosed, which removes an inorganic film from a bending area and minimizes a crack of a routing line to enable an extreme bending. The organic light emitting display device comprises a substrate having a display area and a bending area; a display assembly provided on a display area of the substrate; a routing line arranged on the bending area of the substrate and connected to the display assembly; and an organic layer provided on the bending area of the substrate, covering the routing line, wherein the bending area of the substrate has only the routing line and the organic layer.

13 Claims, 3 Drawing Sheets

(56) References Cited

U.S. PATENT DOCUMENTS

| | | | |
|---|---|---|---|
| 2016/0219696 A1 | 7/2016 | Choi et al. | |
| 2016/0308151 A1 | 10/2016 | Kim et al. | |
| 2017/0090661 A1 | 3/2017 | Kim et al. | |
| 2017/0179423 A1 | 6/2017 | Kwon et al. | |
| 2017/0179432 A1* | 6/2017 | Visweswaran | H01L 27/3262 |
| 2018/0090699 A1 | 3/2018 | Shin et al. | |

FOREIGN PATENT DOCUMENTS

| | | |
|---|---|---|
| CN | 105789255 A | 7/2016 |
| CN | 205376529 U | 7/2016 |
| CN | 106205394 A | 12/2016 |
| CN | 106486520 A | 3/2017 |
| JP | 2011-154798 A | 8/2011 |
| JP | 2014-197181 A | 10/2014 |
| JP | 2017-111437 A | 6/2017 |
| JP | 2017-116904 A | 6/2017 |
| JP | 2017-157034 A | 9/2017 |
| KR | 10-2014-0099164 A | 8/2014 |
| KR | 10-2015-0136246 A | 12/2015 |
| KR | 10-2016-0093125 A | 8/2016 |

\* cited by examiner

ORGANIC LIGHT EMITTING DISPLAY DEVICE

CROSS REFERENCE TO RELATED APPLICATIONS

This application claims the benefit of Korean Patent Application No. 10-2017-0097342 filed on Jul. 31, 2017 and U.S. patent application Ser. No. 16/040,239 filed Jul. 19, 2018, which are both hereby incorporated by reference for all purposes as if fully set forth herein.

BACKGROUND

Technical Field

The present disclosure relates to an organic light emitting display device.

Description of the Related Art

Recently, with the advancement of the information age, a demand for a display device for displaying an image has been increased in various forms. Among the display devices, an organic light emitting display device is a self-light emitting device, and has advantages of a wide viewing angle, an excellent contrast ratio and a fast response speed. Therefore, the organic light emitting display device has received much attention as a next generation display device. Recently, an organic light emitting display device of a slimmer size has been launched. Particularly, a flexible organic light emitting display device has many advantages in that it is easy to carry it and may be applied to various shaped devices.

Since the flexible organic light emitting display device includes a bending area that may fold a substrate and may reduce a bezel size by folding the substrate at the bending area, the flexible organic light emitting display device may be realized as an organic light emitting display device having a narrow bezel.

However, as a bending level is increased to have a narrower bezel, problems occur in that an inorganic film included in the bending area may be broken due to vulnerability to stress, and breaking occurs due to a crack generated in a routing line of the bending area.

BRIEF SUMMARY

Accordingly, the present disclosure is directed to an organic light emitting display device that substantially obviates one or more problems due to limitations and disadvantages of the related art.

An advantage of the present disclosure is to provide an organic light emitting display device that removes an inorganic film from a bending area and minimizes a crack of a routing line to enable an extreme bending.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided an organic light emitting display device comprising a substrate having a display area and a bending area; a display assembly provided on a display area of the substrate; a routing line arranged on the bending area of the substrate and connected to the display assembly; and an organic layer provided on the bending area of the substrate, covering the routing line, wherein the bending area of the substrate has only the routing line and the organic layer.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
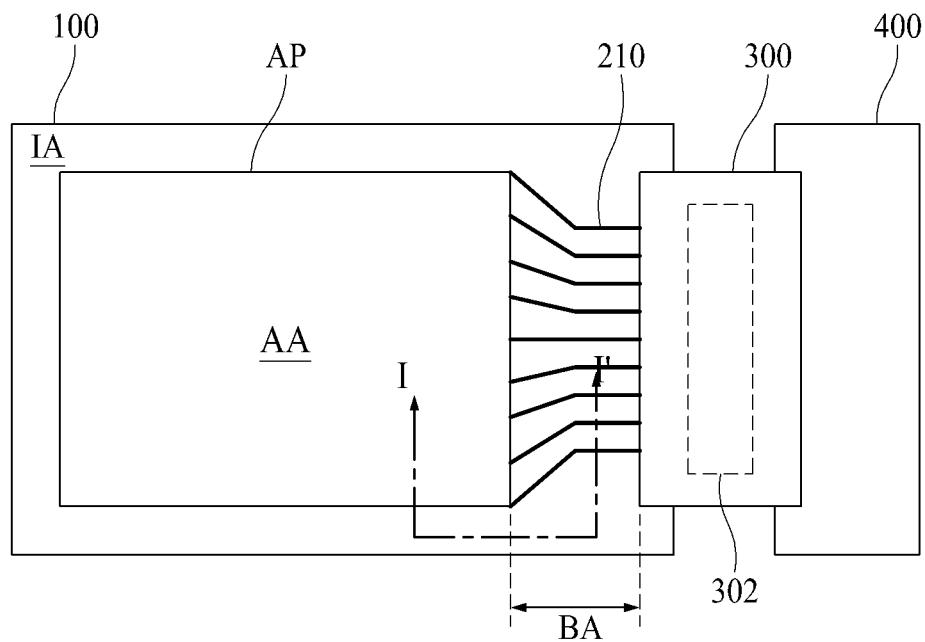
FIG. 1 is a plane view illustrating an organic light emitting display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary. If the term, "only" is used, then it means no other parts or structures are present.

In construing an element, the element is construed as including a tolerance or an error range, even if there is no explicit description.

In describing a position relationship, for example, when the position relationship is described as 'upon~', 'above~', 'below~', and 'next to~', one or more parts may be arranged between two other parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"A first horizontal-axis direction", "a second horizontal-axis direction" and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings. Wherever possible, the same reference numbers will be used throughout the drawings to refer to the same or like parts.

Figure 2:
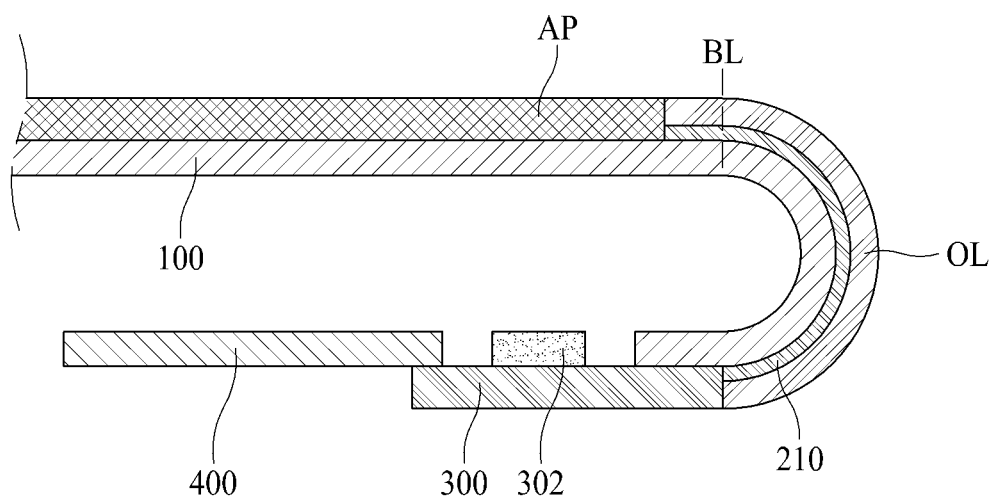
FIG. 2 is a cross-sectional view illustrating that an organic light emitting display device of FIG. 1 is folded.

FIG. 1 is a plane view illustrating an organic light emitting display device according to one embodiment of the present disclosure in the unfolded position and FIG. 2 is a cross-sectional view illustrating that an organic light emitting display device of FIG. 1 after it is folded.

Referring to FIGS. 1 and 2, the organic light emitting display device according to one embodiment of the present disclosure comprises a substrate 100, a display assembly AP, a driver 300, and a circuit board 400.

The substrate 100 is a thin film transistor array substrate, and may be made of a glass or plastic material. The substrate 100 according to one embodiment includes a display area AA and a non-display area IA.

The display area AA is provided at a part other than edge parts of the substrate 100. The display area AA may be defined as an area where a display assembly AP for displaying an image is arranged.

The non-display area IA is provided at a part other than the display area AA provided in the substrate 100, and may be defined as the edge parts of the substrate 100 surrounding the display area AA. The non-display area IA is in the periphery outside the display area AA, and an image is not displayed on the non-display area IA unlike the display area AA. The non-display area IA includes a bending area BA connected with the driver 300.

The bending area BA is an area arranged in the non-display area IA, and is an area where a routing line 210 for connecting the driver 300 with the display assembly AP is arranged. The bending area BA is an area provided to fold a part of the non-display area IA in one direction, and serves to reduce a bezel of the organic light emitting display device according to the present disclosure. An element for facilitating bending is arranged in the bending area BA according to one embodiment, and its detailed structure will be described later.

The display assembly AP is provided on the display area AA of the substrate 100. The display assembly AP according to one embodiment is connected with the driver 300 through the routing line 210, and displays an image by receiving image data supplied from a display driving system. A detailed structure of the display assembly AP will be described later.

The driver 300 is connected to a pad part provided in the non-display area IA of the substrate 100, and displays an image corresponding to the image data supplied from the display driving system on the display area AA. The driver 300 according to one embodiment includes a driving circuit, and may be a chip on film structure. For example, the driver 300 includes a flexible film, a driving IC(302) arranged on the flexible film, and a plurality of driving terminals arranged at one edge of the flexible film.

The circuit board 400 is electrically connected with the driver 300. The circuit board 400 according to one embodiment serves to transfer a signal and power between elements of the driver 300. The circuit board 400 may be a printed circuit board having flexibility.

Referring to FIG. 2 again, the bending area BA of the substrate 100 may be folded in one direction. In detail, a bending line BL may be arranged at a distance spaced apart from the edges of the display assembly AP formed on the substrate 100. The bending line BL may be a line for folding the substrate 100. As the bending line BL is arranged to adjoin the edges of the display assembly AP, a bezel of the organic light emitting display device may be minimized.

Figure 3:
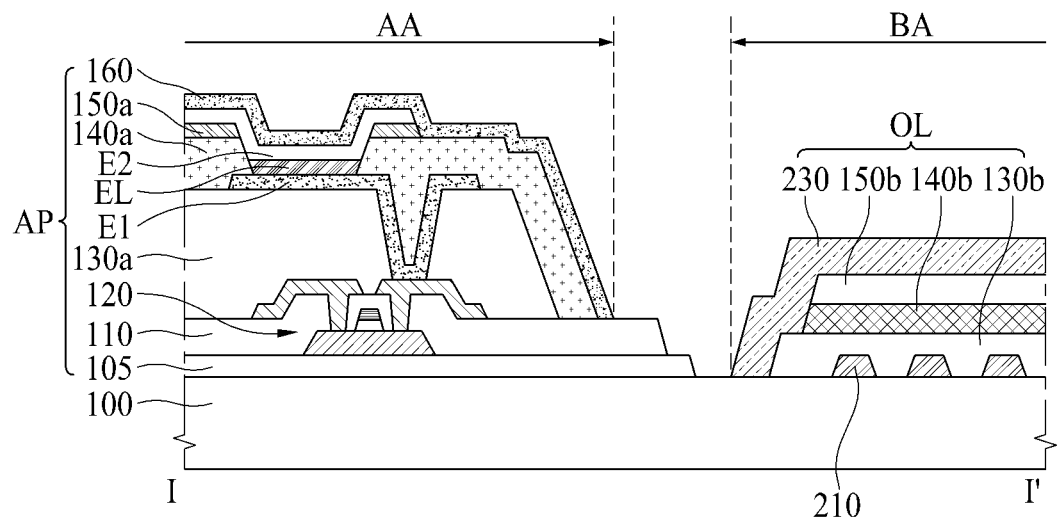
FIG. 3 is a cross-sectional view taken along the folded line I-I' of FIG. 1, illustrating an organic light emitting display device according to one embodiment of the present disclosure.
Figure 4:
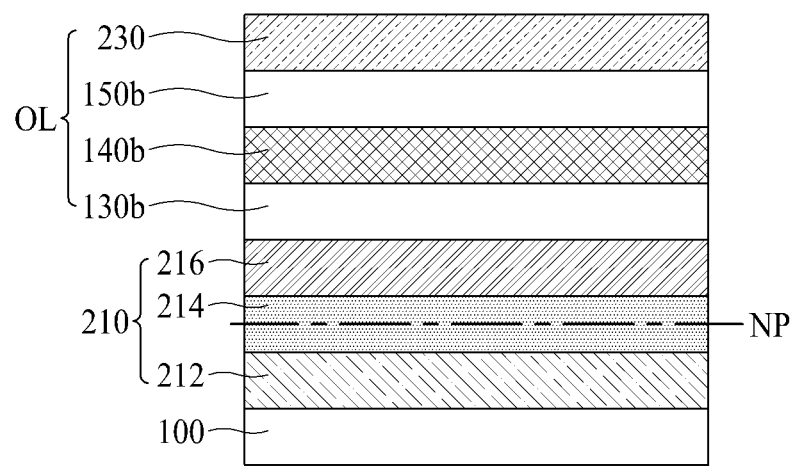
FIG. 4 is a cross-sectional view illustrating an organic light emitting display device according to one embodiment of the present disclosure, wherein a structure of a bending area is enlarged in an organic light emitting display device shown in FIG. 3.

FIG. 3 is a cross-sectional view taken along line I-I' of FIG. 1, illustrating an organic light emitting display device according to one embodiment of the present disclosure, and FIG. 4 is a cross-sectional view illustrating an organic light emitting display device according to one embodiment of the present disclosure, wherein a structure of a bending area is enlarged in an organic light emitting display device shown in FIG. 3.

Referring to FIGS. 3 and 4, the organic light emitting display device according to on embodiment includes a substrate 100, a display assembly AP, a routing line 210, and an organic layer OL.

The substrate 100 is a thin film transistor array substrate, and may be made of a glass or plastic material. The substrate 100 according to one embodiment includes a display area AA and a bending area BA. The substrate 100 may be formed to have the same thickness on the display area AA and the bending area BA.

The display assembly AP is provided on the display area AA of the substrate 100. The display assembly AP according to one embodiment includes a buffer layer 105, a thin film transistor 120, a first planarization layer 130a, a first bank layer 140a, a first pacer 150a, a first electrode E1, a light emitting layer EL, a second electrode E2, and an encapsulation layer 160.

The buffer layer 105 is provided on the display area AA of the substrate 100. The buffer layer 105 according to one embodiment serves to prevent water from being permeated into the display assembly AP. The buffer layer 105 may be made of, but not limited to, an inorganic insulating material, for example, a silicon dioxide ($SiO_2$), a silicon nitride (SiNx) or a multi-layered layer of $SiO_2$ and SiNx.

The thin film transistor 120 is provided on the buffer layer 105. The thin film transistor 120 controls the amount of a current flowing from the driver 300 to the light emitting layer EL. To this end, the thin film transistor 120 includes a gate electrode, a drain electrode, and a source electrode. The thin film transistor 120 may allow a light emitting diode formed in the light emitting layer EL to emit light at brightness proportional to a data signal supplied from a data line by controlling a data current flowing from the driver 300 to the light emitting layer EL.

The thin film transistor 120 according to one embodiment may include a gate insulating layer 110 for covering a gate electrode. The gate insulating layer 110 may include a single layer or a plurality of layers made of an inorganic material, and may be made of a silicon oxide (SiOx), a silicon nitride (SiNx), etc.

The first planarization layer 130a is provided in the display area AA of the substrate 100 to cover the thin film transistor 120. The first planarization layer 130a provides a planarization surface on the thin film transistor 120 while protecting the thin film transistor 120. The first planarization layer 130a according to one embodiment may be made of an organic material such as benzocyclobutene and photo acryl, but may preferably be made of a photo acrylic material for convenience of process.

The first bank layer 140a is provided on the first planarization layer 130a to cover edge parts of the first electrode E1 and the thin film transistor 120, thereby defining an opening area which forms a light emitting area. The first bank layer 140a according to one embodiment may include an organic material such as benzocyclobutadiene, acryl and polyimide. Additionally, the first bank layer 140a may be formed of a photoresist material containing a black pigment. In this case, the first bank layer 140a serves as a light-shielding member (or black matrix).

The first spacer 150a is provided at edge parts of the first bank layer 140a. The first spacer 150a is provided to prevent a dark spot defect from occurring due to a contact between a mask and the first electrode E1 during a deposition process of the light emitting layer EL. The mask has a sagging part which may be in contact with the first electrode E1. The first spacer 150a according to one embodiment may be provided on the first bank layer 140a to allow the mask to be spaced apart from the first electrode E1. Therefore, since the mask and the first electrode E1 are not in contact with each other, a dark spot defect may be prevented from occurring.

The first electrode E1 is an anode electrode, and is provided on the first planarization layer 130a in a pattern shape. The first electrode E1 according to one embodiment is electrically connected with the source electrode of the thin film transistor through a contact hole provided in the first planarization layer 130a to receive a data current output from the thin film transistor. The first electrode E1 may be made of a metal material having high reflectivity, and for example, may include, but is not limited to, a material such as Au, Ag, Al, Mo and Mg, or their alloy.

The light emitting layer EL is provided on the first electrode E1 of the opening area defined by the first bank layer 140a. The light emitting layer EL according to one embodiment may include a hole injecting layer, a hole transporting layer, an organic light emitting layer, an electron transporting layer, and an electron injecting layer. In this case, the one or two or more of the hole injecting layer, the hole transporting layer, the electron transporting layer and the electron injecting layer may be omitted. Also, the light emitting layer EL may further include at least one function layer for controlling electrons and/or holes injected into the organic light emitting layer.

The second electrode E2 is provided on the substrate 100 to cover the light emitting layer EL and the first bank layer 140a, and is commonly connected with the light emitting layer EL. The second electrode E2 may be defined as a cathode electrode or common electrode in accordance with a direction of a current flowing to the light emitting layer EL. The second electrode E2 receives a cathode power supply provided from the driver 300. In this case, the cathode power supply may be a ground voltage or a direct current voltage having a predetermined level.

The second electrode E2 according to one embodiment may be made of a transparent metal material having high light transmittance. For example, the second electrode E2 may include ITO (indium tin oxide), IZO (indium zinc oxide), IZTO (indium zinc tin oxide), ICO (indium cesium oxide) or IWO (indium tungsten oxide), which is a transparent conductive material such as TCO (transparent conductive oxide). Selectively, in this embodiment, to minimize damage of the light emitting layer EL due to a process temperature when the second electrode E2 is formed, the second electrode E2 may be formed of an amorphous transparent conductive material by a low temperature metal deposition process having a process temperature less than 100° C. That is, if the second electrode E2 is formed of a crystalline transparent conductive material, a problem occurs in that the light emitting layer EL is damaged by a high temperature heat treatment process performed for the second electrode E2 to obtain a low resistance value. Therefore, it is preferable that the second electrode E2 is formed of an amorphous transparent conductive material by a low pressure metal deposition process.

The encapsulation layer 160 is provided on the light emitting layer EL to protect the light emitting layer EL vulnerable to external water or oxygen by preventing water from being permeated into the light emitting layer EL. That is, the encapsulation layer 160 is provided on the substrate 100 to cover the second electrode E2. The encapsulation layer 160 according to one embodiment may be formed of an inorganic layer or organic layer, or may be formed of a multi-layered structure in which the inorganic layer and the organic layer are deposited alternately.

The routing line 210 is provided on the bending area BA of the substrate 100. The routing line 210 according to one embodiment serves to electrically connect the driver 300 with the display assembly AP, and may be formed of a metal line.

The routing line 210 according to one embodiment may be formed of a linear metal line to have a fine pattern due to UHD design of the organic light emitting display device.

Since the routing line 210 should transmit a data signal to the display assembly AP within a limited space, a line width and a line interval may be formed to have a range from 2 µm to 4 µm.

The routing line 210 according to one embodiment includes a first metal layer 212, a second metal layer 214, and a third metal layer 216.

The first metal layer 212 is provided at the lowest part of the routing line 210 in direct contact with the substrate 100. The first metal layer 212 according to one embodiment may be formed of a metal, such as Ti, which has high solidity as compared to aluminum, and therefore may protect the routing line 210 from external impact.

The second metal layer 214 is provided on the first metal layer 212. The second metal layer 214 according to one embodiment may be formed of a metal, such as Al, which has good malleability and ductility. The second metal layer 214 is formed to have a thickness thicker than the first metal layer 212 and the third metal layer 216. Note that FIG. 4 is not to scale for the thickness of the layers 100, 212, 214 and 216. In a preferred embodiment, layer 214 will be measureable thicker than layers 212 or 216. Since layer 214 is more malleable and ductile than layer 212, it can be made thicker, in some cases, more than twice as thick. Substrate 100 may also be thicker than each of the layers 212, 214, 216, and in some cases, thicker than the combination of all these layers 210, see for example FIGS. 2 and 3, which are drawn having a different relative scale.

The third metal layer 216 is provided on the second metal layer 214. The third metal layer 216 according to one embodiment may be formed of the same material as that of the first metal layer 212 to protect the routing line 210 from external impact, and is preferably formed at the same thickness as that of the first metal layer 212.

The organic layer OL is provided on the bending area BA of the substrate 100 to cover the routing line 210. The organic layer OL according to one embodiment is formed of only an organic material that may be deposited during a deposition process of the display area AA of the substrate 100. The organic layer OL includes a second planarization layer 130b, a second bank layer 140b, a second spacer 150b, and a micro-coating layer 230.

The second planarization layer 130b is provided at the lowest part of the organic layer OL to cover the routing line 210. The second planarization layer 130b provides a planarization surface on the routing line 210 while protecting the routing line 210. The second planarization layer 130b according to one embodiment is made of the same organic material as that of the first planarization layer 130a, and is patterned during a deposition process for forming the first planarization layer 130a and thus formed together with the first planarization layer 130a.

The second bank layer 140b is provided on the second planarization layer 130b. The second bank layer 140b according to one embodiment is made of the same organic material as that of the first bank layer 140a, and is patterned during a deposition process for forming the first bank layer 140a and thus formed together with the first bank layer 140a.

The second spacer 150b is provided on the second bank layer 140b. The second spacer 150b according to one embodiment is made of the same organic material as that of the first spacer 150a, and is patterned during a deposition process for forming the first spacer 150a and thus formed together with the first spacer 150a.

The micro-coating layer 230 is provided on the entire surface of the bending area BA of the substrate 100 to cover the second spacer 150b. The micro-coating layer 230 according to one embodiment may be made of a photo-hardening resin, and may be coated on target areas of the organic light emitting display device according to the present disclosure. In this respect, the micro-coating layer 230 may be coated on the entire surface of the bending area BA.

The micro-coating layer 230 according to one embodiment may be coated at a predetermined thickness to control a neutral plane NP of a part formed on the bending area BA of the substrate 100 in the organic light emitting display device according to this embodiment. In more detail, the neutral plane NP in the bending area BA of the organic light emitting display device may be controlled to be arranged on the routing line 210 by the micro-coating layer 230.

The substrate 100 is stretched at one side and shrunk at the other side an amount based on its relative location as a plane as the substrate 100 is bent. When the entire structure is bent, a neutral plane NP is present throughout the bend. The NP is that plane which is neither stretched or shrunk when the entire substrate structure 100 is bent. Namely, it suffers no elastic deformation. Hereinafter, the neutral plane NP means a neutral plane NP of a part formed in the bending area BA of the substrate 100 in the organic light emitting display device according to this embodiment. In the organic light emitting display device according to one embodiment, the organic layer OL may be formed on the bending area BA to control the location of the neutral plane NP. For example, as the micro-coating layer 230 is coated thickly, the neutral plane NP ascends toward the upper part of the substrate and then may be arranged on the routing line 210. As the second spacer 150b is formed on the bending area BA, the neutral plane NP ascends by increasing the thickness of the second spacer 150b, whereby the neutral plane NP may be arranged to be located on an area more vulnerable to stress even on the routing line 210.

The thickness of spacer layer 150b and the micro-coating layer 230 are selected to place the NP at a selected location in the routing line 210. If the neutral plane NP is arranged to be in the routing line 210, this will result in that particular plane in the routing line 210 not being compressed or stretched at all when the substrate 100 is bent. In addition, the entire routing line will be very close to the NP, some parts just slightly above it and some parts just slightly below it, so the entire routing line 210 will undergo very little compression or stretching when the substrate 100 is folded. The routing line 210 is therefore subjected to bending stress within a minimum range and the stress may be minimized, a crack is not generated in routing line 210, even in the case of an extreme bending, whereby the organic light emitting display device may have a narrower bezel.

In this way, the routing line 210 and the organic layer OL are only formed on the bending area BA of the substrate 100, and no inorganic film is formed thereon. Since the inorganic film is vulnerable to stress to increase a bending level, the inorganic film is easily broken, whereby there is a difficulty in that the organic light emitting display device has a narrower bezel. On the other hand, since the organic light emitting display device according to the present disclosure has a structure in which an inorganic film is completely removed from the bending area, the organic light emitting display device of the present disclosure may have a narrower bezel because a crack is not generated even in case of an extreme bending.

Figure 5:
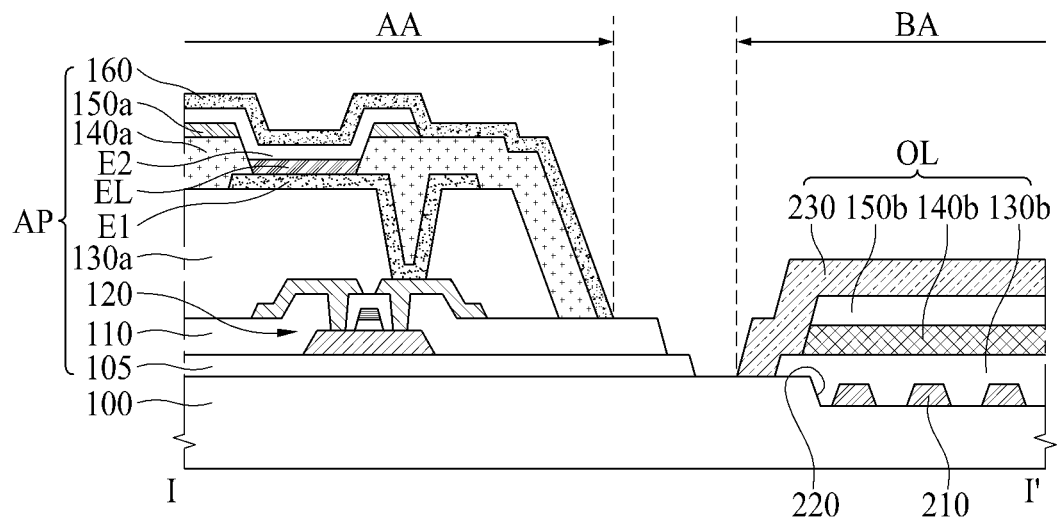
FIG. 5 is a cross-sectional view illustrating an organic light emitting display device according to one embodiment of the present disclosure, wherein a structure of a substrate is varied from an organic light emitting display device shown in FIG. 3.

FIG. 5 is a cross-sectional view illustrating an organic light emitting display device according to one embodiment of the present disclosure, wherein a structure of a substrate is varied from an organic light emitting display device shown in FIG. 3.

Referring to FIG. 5, the organic light emitting display device according to one embodiment of the present disclosure includes a concave part 220 arranged on the bending area BA of the substrate 100 and concavely formed from the substrate 100. Hereinafter, repeated description of elements repeated with those of FIG. 3 will be omitted, and description will be given based on the concave part 220.

The concave part 220 is concavely provided in the bending area BA to have a certain depth D from the upper surface of the substrate formed in the display area AA. At this time, the concave part 220 may be formed to have a depth set such that the neutral plane NP may be arranged on the routing line 210. For example, the concave part 220 may be provided to have a depth of 2 μm from the upper surface of the substrate 100 formed in the display area AA. The concave part 220 may have, but not limited to, a groove or cup shape.

The concave part according to one embodiment includes a bottom surface, which has a depth D from the upper surface of the substrate 100 formed in the display area AA. The routing line 210 is provided on the bottom surface of the concave part 220, and is formed to be directly in contact with the bottom surface of the concave part 220.

The concave part 220 according to one embodiment may arrange the neutral plane NP on the routing line 210. The routing line 210 may generate a crack during bending and may cause breaking, whereby there is a difficulty in that the organic light emitting display device has a narrower bezel. If the neutral plane NP is arranged on the routing line 210, since the routing line 210 may be subjected to bending stress within a minimum range, stress may be minimized, and a crack is not generated even in case of an extreme bending, whereby the organic light emitting display device may have a narrower bezel.

The neutral plane NP may be arranged on the second metal layer 214 by the concave part 220 as shown in FIG. 4. The second metal layer 214 is formed of a material having high malleability, and severs to transmit a data signal to the display assembly AP. If a crack is generated in the second metal layer 214, breaking may be caused, whereby it is preferable for an extreme bending that the neutral plane NP is arranged on the second metal layer 214.

Figure 6:
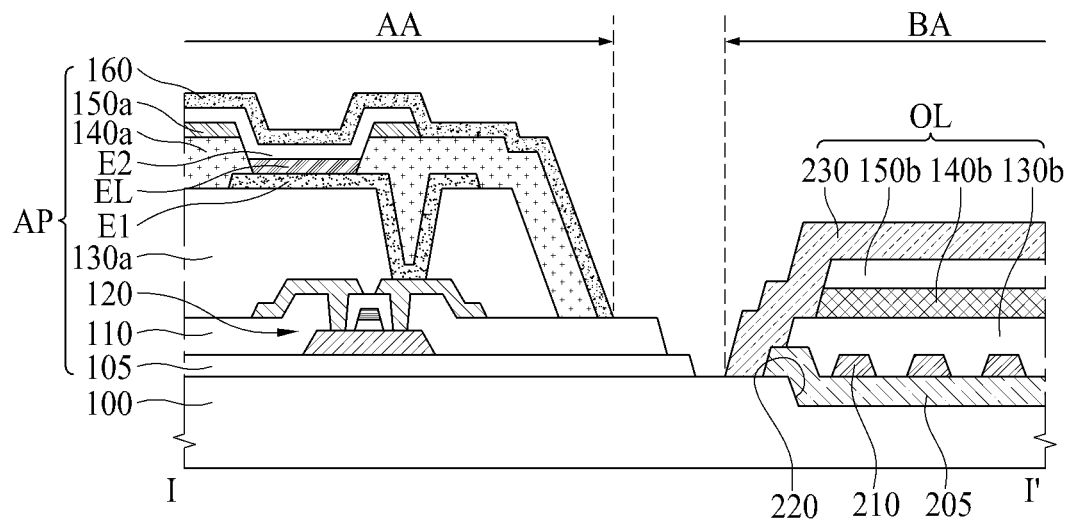
FIG. 6 is a cross-sectional view illustrating an organic light emitting display device according to one embodiment of the present disclosure, wherein a lower film is additionally provided in an organic light emitting display device shown in FIG. 4.

FIG. 6 is a cross-sectional view illustrating an organic light emitting display device according to one embodiment of the present disclosure, wherein a lower film is additionally provided in an organic light emitting display device shown in FIG. 4.

Referring to FIG. 6, the organic light emitting display device according to one embodiment of the present disclosure includes a lower film 205 provided on the concave part 220. Hereinafter, repeated description of elements repeated with those of FIGS. 3 and 5 will be omitted, and description will be given based on the lower film 205.

The lower film 205 is interposed between the bottom surface of the concave part 220 and the routing line 210. The lower film 205 is provided to facilitate adhesion between the substrate h made of a plastic or glass material and the routing line 210 made of a metal material. The lower film may be made of an organic material such as benzocyclobutene and photo acryl, but may preferably be made of a photo acrylic material for convenience of process. That is, since the lower film 205 is interposed between the substrate 100 and the routing line 210, the substrate 100 is not directly coupled with the routing line 210 but coupled with the routing line 210 through the lower film 205 formed on the substrate 100, whereby a coupling force may be reinforced.

As described above, the organic light emitting display device according to the present disclosure has an advantage in that it is optimized to reduce the stress in the metal routing line 210 to enable an extreme bending of the bending area.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. Thus, the above embodiments are to be considered in all respects as illustrative and not restrictive. The scope of the disclosure should be determined by reasonable interpretation of the appended claims and all change which comes within the equivalent scope of the disclosure are included in the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device comprising:
   a substrate having a display area and a bending area;
   a buffer layer positioned on the substrate;
   a light emitting layer;
   a thin film transistor positioned on the buffer layer and configured to control a data current to the light emitting layer;
   a first planarization layer positioned on the thin film transistor;
   a routing line positioned on the buffer layer in the bending area and electrically connected to the thin film transistor, wherein the routing line includes at least a first, second, and third electrically conductive layer, the first electrically conductive layer having a first solidity and the second electrically conductive layer having a second solidity less than the first solidity;
   a second planarization layer having a first thickness disposed on the routing line in the bending area; and
   a micro-coating layer having a second thickness positioned on the second planarization layer,
   wherein a sum of the first thickness of the second planarization layer and the second thickness of the micro-coating layer is selected to place a neutral plane of the substrate through the routing line.

2. The organic light emitting display device of claim 1, wherein the substrate has a third thickness that is greater than the sum of the first thickness of the second planarization layer and the second thickness of the micro-coating layer.

3. The organic light emitting display device of claim 1, wherein the first thickness of the second planarization layer is greater than the second thickness of the micro-coating layer.

4. The organic light emitting display device of claim 1, wherein the first thickness of the second planarization layer is less than the second thickness of the micro-coating layer.

5. The organic light emitting display device of claim 1, wherein the third electrically conductive layer has a third solidity that is greater than the second solidity.

6. The organic light emitting display device of claim 5, wherein the third solidity of the third electrically conductive layer is equal to the first solidity of the first electrically conductive layer.

7. The organic light emitting display device of claim 1, wherein the first electrically conductive layer is titanium and the second electrically conductive layer is aluminum.

8. The organic light emitting display device of claim 1, wherein the neutral plane is proximate the interface between first and second electrically conductive layers.

9. The organic light emitting display device of claim 1, wherein the neutral plane is proximate a central region of the second electrically conductive layer.

10. The organic light emitting display device of claim 1, wherein a thickness of the first electrically conductive layer is less than a thickness of the second electrically conductive layer.

11. The organic light emitting display device of claim 1, further comprising:

an organic layer positioned on the bending area of the substrate and disposed on the routing line.

12. The organic light emitting display device of claim 11, wherein the only structures on the bending area of the substrate are the routing line and the organic layer.

13. The organic light emitting display device of claim 11, wherein the organic layer includes:

the second planarization layer;

a second bank layer positioned on the second planarization layer; and the micro-coating layer positioned on the second bank layer, the micro-coating layer disposed on an entire surface of the substrate in the bending area.

\* \* \* \* \*